US010992416B2

(12) United States Patent

Oveis Gharan et al.

(10) Patent No.: US 10,992,416 B2

(45) Date of Patent: Apr. 27, 2021

(54) FORWARD ERROR CORRECTION WITH COMPRESSION CODING

(71) Applicants: Shahab Oveis Gharan, Ottawa (CA); Mohammad Ehsan Seifi, Ottawa (CA); Kim B. Roberts, Ottawa (CA)

(72) Inventors: Shahab Oveis Gharan, Ottawa (CA); Mohammad Ehsan Seifi, Ottawa (CA); Kim B. Roberts, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 0 days.

(21) Appl. No.: 16/802,129

(22) Filed: Feb. 26, 2020

(65) Prior Publication Data

US 2020/0195377 A1 Jun. 18, 2020

Related U.S. Application Data

(63) Continuation of application No. 15/703,180, filed on Sep. 13, 2017, now Pat. No. 10,615,913.

(51) Int. Cl.
*H04L 1/00* (2006.01)
*H03M 13/00* (2006.01)
(Continued)

(52) U.S. Cl.
CPC ...... *H04L 1/0057* (2013.01); *H03M 13/2906* (2013.01); *H03M 13/2942* (2013.01);
(Continued)

(58) Field of Classification Search
None
See application file for complete search history.

(56) References Cited

U.S. PATENT DOCUMENTS 5,719,884 A 2/1998 Roth et al.
9,537,608 B2 1/2017 Oveis Gharan et al.
(Continued)

FOREIGN PATENT DOCUMENTS

EP 1324527 7/2003
EP 2141816 1/2010
(Continued)

OTHER PUBLICATIONS

Lajos Hanzo; T. H. Liew; B. L. Yeap; R. Y. S. Tee; Soon Xin Ng, "Coded Modulation Theory and Performance," in Turbo Coding, Turbo Equalisation and Space-Time Coding: Exit-Chart-Aided Near-Capacity Designs for Wireless Channels , IEEE, 2011, pp. 385-463, doi: 10.1002/9780470978481.ch14. (Year: 2011).*
(Continued)

*Primary Examiner* — Daniel F. McMahon
(74) *Attorney, Agent, or Firm* — Integral IP; Amy Scouten; Miriam Paton

(57) ABSTRACT

Compression coding may be used with forward error correction (FEC) coding to provide higher information rates by reducing the proportion of redundant bits relative to information bits that are transmitted from a transmitter to a receiver. In one example, first determiners and second determiners are calculated from a set of information bits, where each first determiner is calculated from a different first subset of the information bits along a first dimension, and each second determiner is calculated from a different second subset of the information bits along a second dimension that differs from the first dimension. First and second nubs are calculated from the first and second determiners, respectively, each nub comprising a number of redundant bits that is less than the number of bits in the determiners from which the nub is calculated. The information bits and the nubs are transmitted over one or more communications channels.

20 Claims, 8 Drawing Sheets

(51) Int. Cl.
*H03M 13/29* (2006.01)
*H03M 13/15* (2006.01)

(52) U.S. Cl.
CPC ...... *H03M 13/6312* (2013.01); *H04L 1/0041* (2013.01); *H04L 1/0065* (2013.01); *H03M 13/152* (2013.01); *H03M 13/1515* (2013.01)

(56) References Cited

U.S. PATENT DOCUMENTS

| | | | | |
|---|---|---|---|---|
| 10,367,600 | B2 | 7/2019 | Oveis Gharan et al. | |
| 2002/0196862 | A1* | 12/2002 | Dill | H03M 13/6505 375/265 |
| 2005/0160350 | A1* | 7/2005 | Dror | H03M 13/2906 714/800 |
| 2008/0028280 | A1* | 1/2008 | Ver Steeg | H04L 1/1819 714/776 |
| 2010/0005364 | A1* | 1/2010 | Higurashi | H03M 13/2945 714/755 |
| 2013/0028336 | A1* | 1/2013 | Limberg | H04N 21/2383 375/240.27 |
| 2017/0104496 | A1* | 4/2017 | Zhang | H04B 10/60 |

FOREIGN PATENT DOCUMENTS

| | | |
|---|---|---|
| WO | 2006079442 | 8/2006 |
| WO | 2008006012 | 1/2008 |

OTHER PUBLICATIONS

Gabry, “International Search Report for PCT/IB2018/056746”, dated Dec. 6, 2018.

Gabry, “Written Opinion of ISA for PCT/IB2018/056746”, dated Dec. 6, 2018.

Johannesson, et al., “Decoding of Convolutional Codes”, Fundamentals of Convolutional Coding, IEEE, 2015, pp. 225-331.

McMahon, “First Office Action for U.S. Appl. No. 15/703,180”, dated Apr. 18, 2019.

McMahon, “Notice of Allowance for U.S. Appl. No. 15/703,180”, dated Dec. 27, 2019.

McMahon, “Second Office Action for U.S. Appl. No. 15/703,180”, dated Oct. 3, 2019.

* cited by examiner

ROW 1 — VECTOR 1 — REDUNDANT BITS 1
ROW 2 — VECTOR 2 — REDUNDANT BITS 2
ROW 3 — VECTOR 3 — REDUNDANT BITS 3
ROW K — VECTOR K — REDUNDANT BITS K
FIGURE 2
(PRIOR ART)
ROW 1 — VECTOR 1
ROW 2 — VECTOR 2
ROW 3 — VECTOR 3
ROW K — VECTOR K
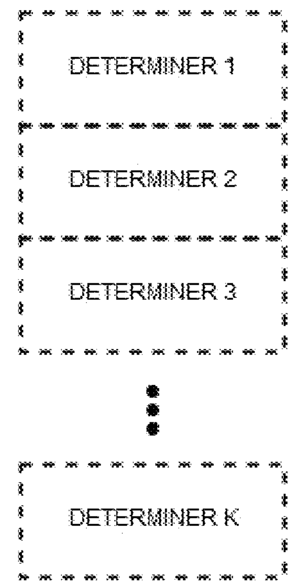
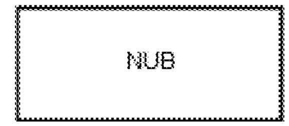
FIGURE 3

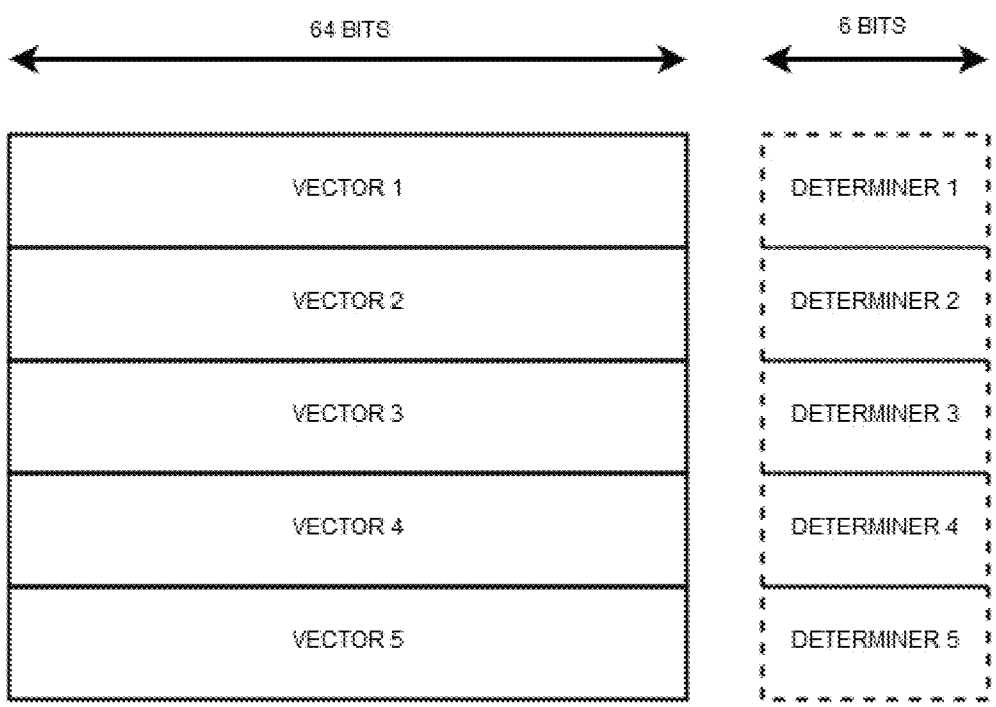
FIGURE 4
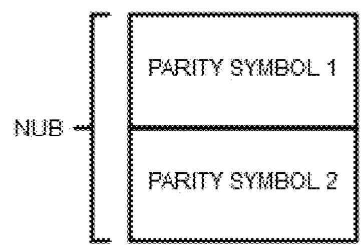

FORWARD ERROR CORRECTION WITH COMPRESSION CODING

TECHNICAL FIELD

This document relates to the technical field of communications, and specifically to techniques for error control and correction.

BACKGROUND

In communications, a transmitter uses a particular modulation format to map bits of data to symbols, which it then transmits as a signal over a communications channel to a receiver. The receiver applies an inverse process of demodulation to the received signal to produce estimates of the symbols, the data bits, or both. During its transmission over the channel, the signal may experience noise and/or distortion. Noise and/or distortion may also be contributed to the signal by components of the transmitter and/or receiver. The noise and/or distortion experienced by the signal may lead to errors in the symbols or bits recovered at the receiver.

The reliability of a communications channel may be characterised by the Bit Error Ratio or Bit Error Rate (BER), which measures the ratio of the expected number of erroneously received bits (or symbols) to the total number of bits (or symbols) that are transmitted over the communications channel. A given application may have a maximum BER tolerance. For example, an application may require that the BER not exceed $10^{-16}$.

Forward Error Correction (FEC) techniques may be used to reduce the BER. FEC encoding performed at a transmitter maps input information bits to FEC-encoded bits, which include redundant information, such as parity or check symbols. When a systematic FEC code is employed, the FEC-encoded bits output from the FEC encoder consist of redundant bits and the information bits that were input to the FEC encoder. FEC decoding subsequently performed at a receiver uses the redundant information to detect and correct bit errors. In an optical communication network using FEC, the bits of data that undergo modulation at the transmitter have already been FEC-encoded. Similarly, the demodulation performed at the receiver is followed by FEC decoding.

FEC is advantageous in that it may permit error control without the need to resend data packets. However, this is at the cost of increased overhead. The amount of overhead or redundancy added by a FEC encoder may be characterized by the information rate R, where R is defined as the ratio of the amount of input information to the amount of data that is output after FEC encoding (which includes the overhead). For example, if FEC encoding adds 25% overhead, then for every four information bits that are to be FEC-encoded, the FEC encoding will add 1 bit of overhead, resulting in 5 FEC-encoded data bits to be transmitted to the receiver. This corresponds to an information rate $R=4/5=0.8$.

A variety of techniques for FEC encoding and decoding are known. The combination of a FEC encoding technique and the corresponding FEC decoding technique are herein referred to as a "FEC scheme." Stronger FEC schemes provide better protection (i.e., better error detection and correction) by adding more redundancy. However, this is at the expense of a lower information rate. Circuitry to implement stronger FEC schemes may also take up more space, may be more costly, and may produce more heat than circuitry to implement weaker (i.e., higher-rate) FEC schemes.

A FEC scheme may be implemented using hard decision FEC decoding or soft decision FEC decoding. In hard decision FEC decoding, using BPSK as an illustrative example, a firm decoding decision is made by comparing a received signal to a threshold; anything above the threshold is decoded as "1" and anything below the threshold is decoded as "0". In soft decision FEC decoding, additional probability bits are used to provide a more granular indication of the received signal; in addition to determining whether the incoming signal is "1" or "0" based on the threshold, the soft decision FEC decoding also provides an indication of confidence in the decision. While soft decision FEC decoding is more robust than hard decision FEC decoding, it is also more complicated to implement.

A FEC scheme may be selected to satisfy a desired BER tolerance. For example, a hard decision FEC scheme may take input bits having a maximum BER of $10^{-4}$, (i.e., 1 bit error for each 10000-bit block), and may produce output bits having a maximum BER of $10^{-16}$ ($10^{-12}$ bit errors for each 10000-bit block). It is of interest to maximize the information rate, while satisfying a desired BER tolerance.

U.S. Pat. No. 9,537,608 describes a FEC technique referred to as staggered parity, in which parity vectors are computed such that each parity vector spans a set of frames; a subset of bits of each frame is associated with parity bits in each parity vector; and a location of parity bits associated with one frame in one parity vector is different from that of parity bits associated with the frame in another parity vector.

SUMMARY

This document proposes techniques for FEC with compression coding, which may provide higher information rates by reducing the proportion of redundant bits relative to information bits that are transmitted from a transmitter to a receiver.

In one example, at a transmitter end, a plurality of determiners is calculated from a set of information bits, where each determiner is calculated as a first function of a respective first subset of the information bits. A nub is then calculated as a second function of the plurality of determiners, where the nub comprises a number of redundant bits that is less than a number of bits comprised in the plurality of determiners. The set of information bits is transmitted to a receiver in a first manner, and the nub is transmitted to the receiver in a second manner, where the first manner is distinct from the second manner.

In another example, a plurality of first determiners is calculated from a set of information bits, where each first determiner is calculated from a different first subset of the information bits along a first dimension. A first nub is calculated from the plurality of first determiners, where the first nub comprises a first number of redundant bits that is less than a number of bits comprised in the plurality of first determiners. In addition, a plurality of second determiners is calculated from the set of information bits, where each second determiner is calculated from a different second subset of the information bits along a second dimension that differs from the first dimension. An intersection of the plurality of first determiners and the plurality of second determiners comprises at least one bit. A second nub is calculated from the plurality of second determiners, where the second nub comprises a second number of redundant bits that is less than a number of bits comprised in the plurality of second determiners. The set of information bits, the first nub, and the second nub are transmitted over one or more communications channels.

BRIEF DESCRIPTION OF THE DRAWINGS

FIG. 2 illustrates a schematic representation of redundancy included in the rows of a FEC product code, in accordance with prior art;

FIG. 3 illustrates a schematic representation of redundancy compressed into a nub, in accordance with an example of FEC with compression coding;

FIG. 4 illustrates a schematic representation of a first example of FEC with compression coding;

DETAILED DESCRIPTION

Figure 1:
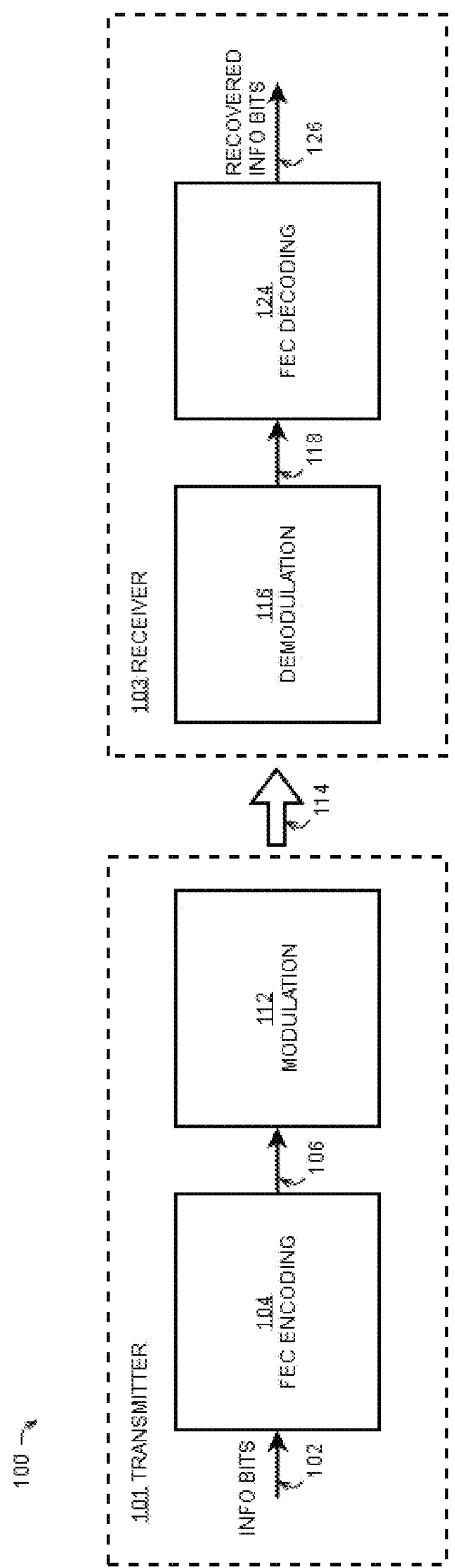
FIG. 1 illustrates a schematic representation of an example communications system configurable to implement techniques for Forward Error Correction (FEC) with compression coding.

A Forward Error Correction (FEC) scheme may be designed to tolerate input bits having a maximum input bit error ratio (BER) and to produce output bits having at most a maximum output BER, where the maximum output BER is adequate for a particular application.

U.S. patent application Ser. No. 15/672,434, filed on Aug. 9, 2017, describes techniques for FEC with contrast coding. Contrast coding may be used to tune the BERs experienced by different subsets of bits, relative to each other, to better match a plurality of FEC schemes. For example, contrast coding may be used to increase the BER of a first subset of bits relative to the BER of a second subset of bits. A strong FEC scheme (with a large amount of redundancy) may be applied to the first subset, and a high-rate FEC scheme (with a small amount of redundancy) may be applied to the second subset.

For a given FEC scheme, it may of interest to add as little overhead as possible to the payload during FEC encoding, thereby maximizing the information rate. In certain circumstances, it may be of interest to use hard decision FEC decoding, which is less complicated to implement than soft decision FEC decoding, and may therefore be less costly and produce less heat. Hard decision FEC decoding is typically performed using vector codes, such as Bose-Chaudhuri-Hocquenghem (BCH) codes, Reed-Solomon (RS) codes, Low-Density Parity Check (LDPC) codes, and other parity codes.

BCH coding involves a process of BCH encoding performed at a transmitter, and BCH decoding performed at a receiver. BCH encoding involves transforming a set of P information bits (also referred to as user bits or payload bits) into a BCH codeword C of length Q bits, where Q>P. The codeword C may be denoted by a sequence of bits (c1, c2, . . . , cN), which includes the P information bits as well as Q-P redundant bits. These Q-P redundant bits are what allows for the correction of errors introduced into the codeword C during transmission to a receiver. The redundant bits may be calculated to satisfy one or more constraints applied to the codeword C. As more constraints are applied to the codeword C, more redundant bits are included, and more error corrections are possible. For example, functions $F_1$ and $F_2$ may be defined that are each linear combinations of the bits of the codeword C, that is, $F_1(C)=\Sigma c_i\ \alpha_1^{\ i}$ and $F_2(C)=\Sigma c_i\ \alpha_2^{\ i}$, where $\alpha_1$ and $\alpha_2$ are members of the Galois Field (GF) $2^q$, and where q is an arbitrary integer that depends on the length of BCH code. The Q-P redundant bits of the codeword C may be forced to have particular values that enable the codeword C to satisfy the constraints $F_1(C)=V$ and $F_2(C)=V$, where V is a constrained value. The expressions $F_1(C)$ and $F_2(C)$ may also be referred to as syndromes of the codeword C. Typically, the redundant bits of the codeword are calculated by constraining one or more syndromes of the codeword C to zero, that is $F_1(C)=0$ and $F_2(C)=0$, but other constraints are possible. The constraint V that is applied to the syndromes is known at the receiver to which the BCH codeword C is transmitted. The example described above uses the convenient systematic formulation, wherein the information bits are transmitted unchanged and the redundant bits are grouped together at the end of the vector. As is well known in the art, there are also non-systematic formulations that satisfy the constraint by changing the values of information bits in specific ways or by including the required redundancy in various locations within the codeword C.

In the event that noise and/or distortion introduces errors during transmission from the transmitter to the receiver, the codeword $\hat{C}$ that is received will differ from the codeword C that was originally transmitted. The syndrome functions $F_1(C)$ and $F_2(C)$ are calculated on the received bits in the receiver. Calculated values other than V indicate the presence and location of bit errors. This indication is used by FEC decoding in its attempts to correct all of these bit errors and to not create new errors in the process.

One can consider the example in which one of the N bits of the received codeword $\hat{C}$ differs from the transmitted codeword C. This single bit error may be detected by calculating the syndrome of the received codeword $\hat{C}$, that is $F_1(\hat{C})$, and observing that $F_1(\hat{C})\neq V$. Using the value of $F_1(\hat{C})$, it may be possible to correct this error and not cause other errors. Additional bit errors might be corrected by calculating additional syndromes, such as $F_2(\hat{C})$. In general, a BCH code that is capable of correcting t errors may be referred to as a t-error-correcting BCH code.

For moderate BER tolerances, such as $10^{-4}$, BCH coding can achieve high information rates as the length of the vector grows towards infinity. However, longer vectors require more corrections, thereby requiring an iterative decoding process that may incur unwanted time delays, more hardware complexity, and more heat. For example, performing the Berlecamp algorithm and Chien search may consume many clock cycles for large block lengths and large values of t. In applications such as 600 Gb/s optical signals, for example, it may be desirable to use fast and simple parallel hardware.

One technique for limiting the number of corrections required per BCH codeword is the use of a product code. In product coding, user bits may be transformed into a two-dimensional array, in which encoded bits are arranged into rows and columns, where each row is a codeword, and each column is also a codeword. In this manner, the same amount of user information may be encoded using multiple shorter-length codewords (each requiring fewer corrections), instead of a single lengthy codeword (requiring many corrections). Error correction of the product code at the receiver may be performed by alternating row decoding and column decoding, also referred to as two-iteration decoding.

U.S. Pat. No. 5,719,884 to Roth et al. describes an error correction method and apparatus based on a two-dimensional code array with reduced redundancy. As discussed in the background of Roth et al., in a typical product code encoder, a two-dimensional array is generated using two RS codes, where a first RS code $C_1$ is applied to the rows, and a second RS code $C_2$ is applied to the columns. Decoding of the product code may be performed by detecting errors using the code $C_1$, and correcting erasures using the code $C_2$. A traditional product code of this type may offer protection for both random errors and burst errors.

Roth et al. are concerned with the problem that, although the code $C_1$ is able to detect whether up to all rows of the array are corrupted, the code $C_2$ is only able to correct up to $r_2$ locations per column, where $r_2$ is the number of redundancy symbols in a column. Thus, information derived from the code $C_1$ about a combination of any more than $r_2$ corrupted rows is effectively useless to the erasure correction operation to be performed with the code $C_2$. The ability of the code $C_1$ to detect extra corrupted rows (which cannot be corrected with the code $C_2$) comes at a price of added redundancy, which serves no useful purpose if the corrupted rows cannot be corrected.

To address this problem, Roth et al. propose a method which eliminates the excess redundancy related to the unused error detection capability of the code $C_1$ by incorporating an intermediate code $C_{1.5}$. According to the encoding method described with respect to FIG. 6 of Roth et al., the columns of a first raw data block D1 are encoded using an RS code $C_2$, thereby adding $C_2$ column code checks to the block D1. The result is combined with a smaller raw data block D2, and, in one example, the remaining area 168 of the two-dimensional array is filled with zeroes. Each row of this intermediate array is then encoded in an intermediate array buffer using an RS code $C_1$, which results in intermediate $C_1$ row code checks, which are split into two portions 170 and 171, where the portion 170 has dimensions corresponding to those of the block D2. Here, Roth et al. introduce the intermediate code $C_{1.5}$ which, similarly to the codes $C_1$ and $C_2$, is also a RS code. The intermediate code $C_{1.5}$ is applied to the intermediate $C_1$ row code checks portion 170, which results in an array 155 of $C_{1.5}$ column code checks. The array 155 is combined with the intermediate $C_1$ row code checks portion 171 using an XOR adder, which yields the final row code checks 198. The row code checks 198 are included in the array 130, together with the data blocks D1, D2, and $C_2$ column code checks 160.

The methods disclosed by Roth et al. are specific to a two-dimensional product code array using RS encoders and decoders. The aim of Roth et al. is to provide a reduced redundancy product code that is able to maintain the same error correction capability as a traditional product code (including burst error protection using erasure correction). Roth et al. achieve this specific aim by using the intermediate RS code $C_{1.5}$ to reduce the redundancy that is present in the rows of the two-dimensional product code array. In particular, Roth et al. disclose that, following the calculation of intermediate $C_1$ row code checks, the RS code $C_{1.5}$ is applied to a first portion of the intermediate $C_1$ row code checks, which results in $C_{1.5}$ column code checks, and then a second portion of the intermediate $C_1$ row code checks is added to the $C_{1.5}$ column code checks in order to obtain the final row code checks 198 that are to be included in the product code array 130. When decoding, Roth et al. use the intermediate code $C_{1.5}$ to identify which rows are erased, and then the code $C_2$ is used to fill in values for the erased rows.

According to the methods disclosed by Roth et al., the redundancy (constituted by the $C_2$ column code checks 160 and the row code checks 198) is always included as part of the product code array 130. Roth et al. only contemplate an intermediate code $C_{1.5}$ that is designed to be a subcode of code $C_2$, such that code blocks of $C_{1.5}$ contain the $r_2$ redundant check symbols computed as for $C_2$, plus an additional set of $r_2$ check symbols. In other words, a portion of the row code checks 198 is always equal to the corresponding column syndrome for code $C_2$. This places a constraint on the type of intermediate code $C_{1.5}$ that can be used.

This document proposes techniques for FEC with compression coding. Similarly to traditional product codes, compression coding may offer an advantage over large-block BCH coding by using many short and relatively simple codes which can be error-corrected in parallel in fewer clock cycles, thereby allowing for a small and very fast hardware implementation, which may be important for chain decoding. However, the compression coding techniques described herein may offer an advantage over traditional product codes by reducing the amount of overhead that is needed to transmit user bits for a given BER tolerance. In one example, the compression coding techniques proposed herein may be used to implement high-rate FEC schemes suitable for use with the contrast coding techniques described in U.S. patent application Ser. No. 15/672,434, filed on Aug. 9, 2017. For example, contrast coding may steer most bit errors away from some of the bit streams, producing a requirement for a very high-rate FEC scheme that is able to take bits having a BER of $10^{-3}$ or $10^{-4}$ and to output bits having a BER$<10^{-16}$.

FIG. 1 illustrates a schematic representation of an example communications system 100 configurable to implement Forward Error Correction (FEC) with compression coding. The communications system 100 comprises a transmitter 101 and a receiver 103, the transmitter 101 being configured to transmit a signal 114 to the receiver 103 over one or more communications channels, where the signal 114 is representative of data to be communicated from the transmitter 101 to the receiver 103. The signal 114 may be transmitted optically, for example using optical fibers, or using other means of wired or wireless communications, with one or more carriers or baseband.

FIG. 1 is merely a schematic illustration. It should be understood that each of the transmitter 101 and the receiver 103 may be embodied by one or more electronic devices and may comprise additional hardware and/or software components that are not shown in FIG. 1. For example, each of the transmitter 101 and the receiver 103 may comprise memory, for example, in the form of a non-transitory computer-readable medium, which stores computer-executable instructions for performing the methods described herein, and one or more processors configurable to execute the instructions. The boxes illustrated in solid lines may be understood to represent computer-executable processes to be executed by the respective processors at the transmitter 101 and the receiver 103. More specifically, one or more processors at the transmitter 101 are configurable to execute code for implementing the processes of FEC encoding 104 and modulation 112, as will be described in more detail below. Similarly, one or more processors at the receiver 103 are configurable to execute code for implementing the processes of demodulation 116 and FEC decoding 124, as will be described in more detail below.

The signal 114 is representative of symbols to be transmitted from the transmitter 101 to the receiver 103, the symbols having been generated according to a particular modulation format defined by the modulation process 112 performed at the transmitter 101, and where each symbol represents a plurality of bits. The symbols, and estimates of the bits they represent, may be recoverable from the corresponding demodulation process 116 performed at the receiver 103, where the demodulation process 116 is the inverse of the modulation process 112. A bit estimate may comprise a binary value, or may comprise a confidence value, such as log-likelihood ratio. A log-likelihood ratio (LLR) is defined as the logarithm of the ratio of the probability of a bit being equal to zero to the probability of that bit being equal to one. For example, for a bit “b”, $$LLR(b) = \log\frac{P(b=0)}{P(b=1)},$$

where P denotes probability.

During its transmission from the transmitter 101 to the receiver 103, the signal 114 may experience noise and/or distortion, including contributions of noise and/or distortion from components of the transmitter 101 and receiver 103 themselves. The noise and/or distortion may lead to errors in the symbols recovered from the demodulation process 116, as well as errors in the bits represented by the symbols.

The processes of FEC encoding 104 and FEC decoding 124 are associated with a FEC scheme that involves compression coding, examples of which will be described throughout this document. FEC with compression coding may be understood by introducing the new terminology “determiner.” A determiner may be defined as a function of a sequence of bits. The function may comprise, for example, a polynomial function or a linear combination of the sequence of bits. A syndrome F(C) of a BCH codeword C may be considered an example of a determiner. However, whereas a syndrome of an error-free codeword is typically constrained to have a particular value that is known in advance to the receiver, such as zero, a determiner may be permitted to have an arbitrary value that is unknown to the receiver.

Given a set of transmitted bits comprising subsets arranged as vectors, a determiner may be considered as a T-bit algebraic syndrome of one of those vectors, where T is an integer greater than four, for example, where the determiner assumes more than T different values as a function of the values of the bits in the vector, and where the determiner is disjoint with the set of transmitted bits.

As previously described, a traditional product code involves the transmitter calculating a syndrome of each row of bits (as well as a syndrome of each column of bits), where each syndrome is constrained to have a known value, such as zero, which is shared with the receiver. In order to satisfy the constraints placed on the syndromes, a portion of the bits in each row and each column are forced to have particular values. These redundant bits are transmitted together with the information bits to the receiver, where they are used to perform error detection and correction.

FIG. 2 illustrates a schematic representation of the redundant bits that might be included in each row of a traditional product code array, according to prior art. For example, in row 1, vector 1 represents the information bits (payload bits), while redundant bits 1 represents the bits that are included to satisfy the constraint: syndrome (row 1)=0. Similarly, in row 2, vector 2 represents the information bits, while redundant bits 2 represents the bits that are included to satisfy the constraint: syndrome (row 2)=0. In this manner, each of the K rows would include the redundant bits needed to satisfy the constraint placed on the syndrome of the respective row. Although not explicitly illustrated, similar constraints would be applied to each column, thereby resulting in additional redundant bits in the columns. The presence of these redundant bits limits the amount of information bits that can be transmitted in an array, which in turn limits the information rate that is achievable with a traditional product code.

According to examples of the technology proposed in this document, instead of constraining the syndrome of each row (and each column) in a product code to have a known value, thereby requiring the presence of redundant bits in each row (and each column), a determiner may be calculated for each row (and each column), where the determiner is not constrained to have a particular value. A determiner may be calculated as a function of a subset of information bits along a particular dimension, such as a row or a column, for example. For example, as illustrated in FIG. 3, in the case of an array with K rows of information bits, a sequence of K determiners is calculated, where K is an integer greater than four. Each determiner is permitted to have an arbitrary value of length T bits, where T is an integer greater than four, for example. Each determiner may consist of single bits or one or more multi-bit symbols. Because there is no constraint placed on the value of a given determiner, there is no need to include redundant bits in the row from which that determiner is calculated. Instead, the FEC redundancy is determined by applying a constraint to the sequence of K determiners. In other words, FEC encoding may be applied to the K determiners, thereby generating the redundancy needed to satisfy the constraint applied to the sequence of K determiners. This redundancy may be defined using the new terminology “nub.” A redundant nub may be calculated as a function of a set of determiners. The nub may consist of single bits, or one or more multi-bit symbols. It is this nub that is transmitted, in addition to the array of K rows of information bits, to the receiver. The K determiners are used in the calculation of the nub, but they are not themselves transmitted to the receiver.

For some applications, it may be of interest to transmit the nub in a manner that is distinct or disj oint from the information bits. For example, the systematic bits may have different properties than the bits of the nub, and accordingly it may be of interest to treat their respective transmissions differently. In other words, the information bits may be transmitted in a first manner over one or more communications channels, and the nub may be transmitted in a second manner over the one or more communications channels, where the first manner is distinct from the second manner. In some examples, the first manner may be distinguished from the second manner by transmission over different communications channels, which may include, for example, performing separate transmissions over separate communications interfaces of a transmitting electronic device. In some examples, the first manner may be distinguished from the second manner by employing different aspects of a modulation format. For example, 4-PAM with Gray labeling inherently produces bits having different BERs, where the least significant bit (LSB) has a BER that is twice that of the most significant bit (MSB). Depending on the application, the nub bits could be encoded as the LSBs, and the information bits could be encoded as the MSBs, or vice versa. In some examples, the first manner may be distinguished from the second manner by employing different FEC encoding schemes. In some examples, the nub may be inserted directly, without alteration or modification, into a structure comprising the information bits, such as a multi-dimensional array. In some examples, the nub may be logically a portion of a rectangular array comprising the set of information bits.

Following receipt of the nub and the array of bits from the transmitter, the receiver may then perform its own calculation of the K determiners from the received array. The receiver may then use the K calculated determiners to perform its own calculation of the nub. In the event that the calculated nub does not match the nub that was received from the transmitter, the receiver may determine that there is an error in one of the determiners, which means that there is an error in the row of bits from which that determiner was calculated. A comparison of the calculated nub to the received nub may allow the receiver to determine which of the K calculated determiners is incorrect, and also to determine the correct value of that determiner. The receiver may then be able to use the difference between the calculated value of the determiner and the correct value of the determiner to identify which bit of the corresponding row of the array is incorrect, and to correct the error.

Although not explicitly illustrated in FIG. 3, similarly to the manner in which the determiners of the rows may be compressed into a nub, it is also possible to calculate determiners of columns, and to compress those determiners into another nub. More generally, a first set of determiners could be calculated in a first dimension and compressed into a first nub, and a second set of determiners could be calculated in a second dimension and compressed into a second nub. At a receiver, the first nub could be used to decode the first set of determiners, and the second nub could be used to decode the second set of determiners, where the first set of determiners apply to a first set of received bits and the second set of determiners apply to a second set of received bits, and where an intersection of the first set and the second set comprises at least one bit. In some examples, the first dimension may be substantially orthogonal to the second dimension. In some examples, determiners could be calculated along one or more additional dimensions, such as diagonally. The calculation of determiners in multiple dimensions may increase the minimum Hamming distance and the error-correcting capability of the compression code. Where the same polynomial is used for calculating the determiners as for compressing along that same dimension to the nub, both nubs will be identical, and there will accordingly be no redundancy cost for performing compression along the second dimension.

In contrast to a traditional product code, in which each row (and each column) of the transmitted array comprises redundant bits, the array that is transmitted using FEC with compression coding need not comprise any redundant bits. Instead, the redundancy is compressed into the nub(s), which can be transmitted outside of the array (i.e., disjoint from the array), and which may be significantly smaller in size than the redundancy that would be present in the rows and columns of a traditional product code array. This is demonstrated schematically by a visual comparison of FIG. 2 to FIG. 3. The proportion of transmitted bits that are information bits (i.e., vectors 1, 2, 3, . . . , K) is higher in FIG. 3, when the redundancy is transmitted in the form of the compressed nub, than in FIG. 2, when the redundancy is transmitted in the form of redundant bits in each row. By increasing the proportion of transmitted bits that are information bits, FEC with compression coding may provide an increased information rate for a given BER tolerance.

FIG. 4 illustrates a schematic representation of a first example of FEC with compression coding. In this example, a set of information bits is arranged at a transmitter into a two-dimensional array consisting of five vectors, where each vector has a length of 64 bits. The information bits in the array are to be encoded at the transmitter for transmission over one or more communications channels to a receiver.

Compression coding is performed by calculating at the transmitter a determiner for each vector. In this example, each determiner is calculated as a 1-error-correcting BCH polynomial residue having a length of T=6 bits. With standard binary BCH coding, in systematic form, each residue would be appended as redundant bits to the respective vector, so as to form a valid BCH codeword having a syndrome of zero, and the five BCH codewords would be transmitted to the receiver. However, with compression coding, the residues are defined as determiners which are not actually transmitted to the receiver. Instead, FEC encoding is applied to the sequence of determiners, thereby generating a nub. The nub is effectively a compressed version of the redundancy which is transmitted with the information bits in order to allow for error correction at the receiver.

In this example, the FEC encoding of the determiners is performed using an RS polynomial with 6-bit symbols (i.e., an RS-6 code), which results in the calculation of a nub in the form of RS parity symbols. For every 2t parity symbols, an RS code can correct up to t symbols. In other words, two RS parity symbols would be needed to correct a single symbol error. In this example, the nub consists of the two RS parity symbols calculated from the set of five determiners. The five vectors of information bits and the nub are transmitted to the receiver.

In this example, the nub consists of two 6-bit symbols and therefore has a total size of 2×6=12 bits. In contrast, the sequence of five determiners, each of which consists of one 6-bit symbol, would have a total size of 5×6=30 bits. Thus, using compression coding and transmitting the nub may result in the transmission of fewer redundant bits relative to what would be transmitted with standard BCH coding. As the number K of determiners increases, for example, K>4, the nub may comprise far fewer bits than the K determiners. A lower proportion of redundant bits in a transmission means a higher information rate.

For simplicity, it is assumed in this example that one of the five vectors received at the receiver contains a single error introduced during transmission. The received vectors and the received nub may be used at the receiver to identify and correct this error. First, for each received vector, a corresponding determiner is calculated. Similarly to the calculation performed at the transmitter, in this example, the receiver calculates for each received vector a 1-error-correcting BCH polynomial residue. For clarity, these calculated residues may be referred to as "receiver-calculated determiners" in order to distinguish them from the original determiners calculated at the transmitter (i.e., the true, correct determiners). As a result of the single error contained in one of the received vectors, it follows that one of the receiver-calculated determiners will be incorrect (i.e., will not match the original determiner that was calculated at the transmitter). As previously noted, the received nub consists of two RS parity symbols, which permits the correction of a single symbol error. Thus, the receiver may correct the single determiner error by apply RS FEC correction to the set of receiver-calculated determiners and the received nub. The RS FEC correction would result in a vector consisting of the five FEC-corrected determiners and the FEC-corrected nub. By noting which determiner was corrected, or by comparing the five FEC-corrected determiners to the receiver-calculated determiners, the receiver is able to identify which one of the five receiver-calculated determiners is incorrect, and thus which one of the five vectors contains the single bit error. By subtracting modulo 26=64 the FEC-corrected determiner from the erroneous receiver-calculated determiner, an error indication may be produced for that vector, and standard BCH error correction may be used to correct the single bit error.

Figure 5:
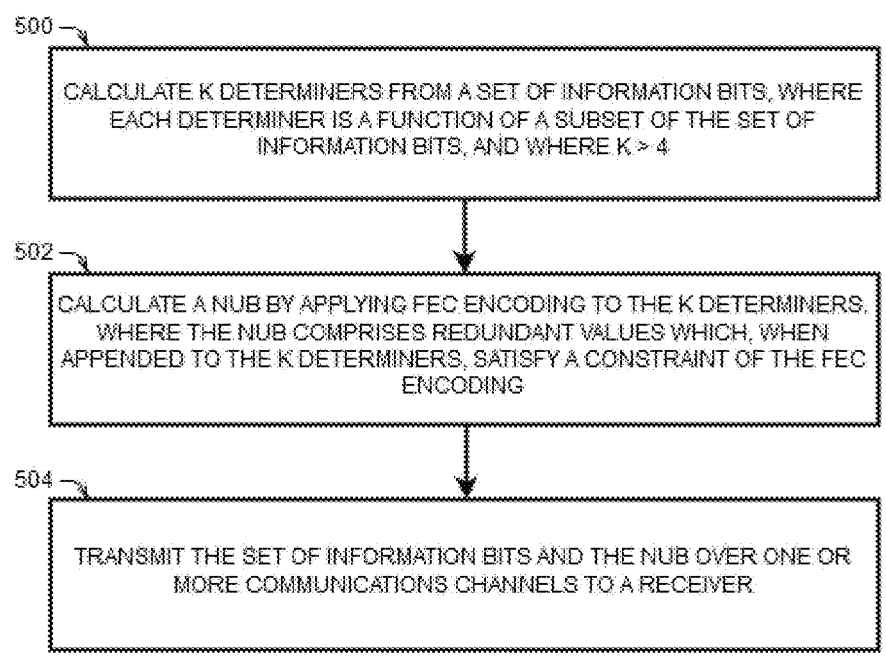
FIG. 5 illustrates a method for data transmission over one or more communications channels, in accordance with some examples of FEC with compression coding.

FIG. 5 illustrates a method for data transmission over one or more communications channels, in accordance with some examples of FEC with compression coding, such as those illustrated in FIG. 3 and FIG. 4.

At 500, a calculation is made at a transmitter based on a set of information bits to be encoded for transmission over one or more communications channels to a receiver. The set of information bits may be divided along one dimension into K subsets, where K is an integer greater than four. For example, each subset may consist of a distinct row of a two-dimensional array of information bits. For each subset, a determiner is calculated, where the determiner is a function of the bits in the subset and has a length of T bits, where T is an integer greater than four, for example. Each determiner may consist of single bits or one or more multi-bit symbols. These calculations result in a sequence of K determiners. Similar calculations may be made for determiners in one or more additional dimensions.

At 502, a nub is calculated at the transmitter by applying FEC encoding to the K determiners. The nub comprises redundant bits or symbols which, when appended to the K determiners, satisfy a constraint of the FEC encoding. The nub may have a length N−K, such that the total length of the determiners and the nub is N, where N>K. One or more additional nubs may be calculated in a similar manner in the event that determiners were calculated in one or more additional dimensions at 500.

At 504, the nub(s) and the set of information bits are transmitted over one or more communications channels to a receiver. In some examples, the nub(s) may be transmitted in a manner that is distinct or disjoint from the information bits. In some examples, the nub(s) and the information bits may be transmitted over different communications channels. In some examples, the nub(s) and the information bits may be transmitted using different aspects of one or more modulation formats, for example, such that they experience different BERs. In some examples, the information bits and the bits that form part of the nub(s) may undergo different FEC encoding schemes. In some examples, the nub(s) may be inserted directly, without alteration or modification, into a structure comprising the information bits, such as a multi-dimensional array. In some examples, the nub may be logically a portion of a rectangular array comprising the set of information bits.

Figure 6:
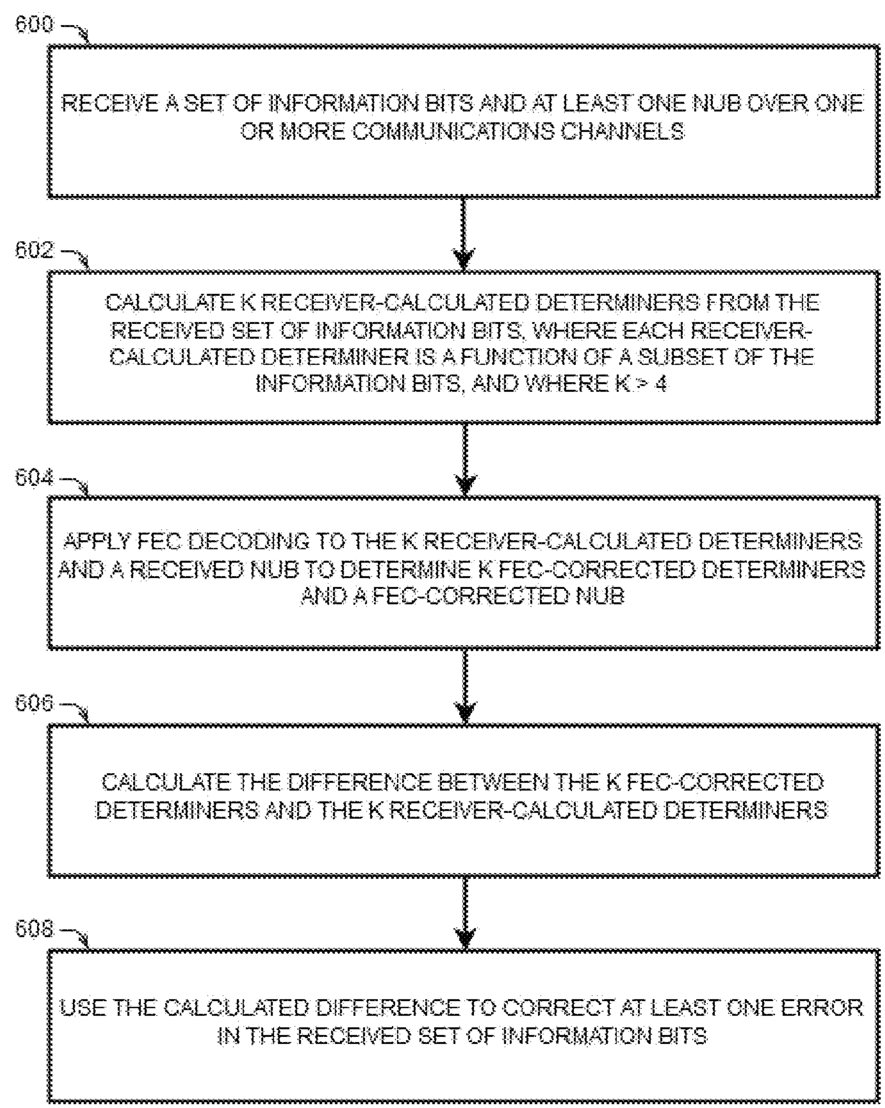
FIG. 6 illustrates a method for decoding information bits received over one or more communications channels, in accordance with some examples of FEC with compression coding.

FIG. 6 illustrates a method for decoding information bits received over one or more communications channels, in accordance with some examples of FEC with compression coding, such as those illustrated in FIG. 3 and FIG. 4.

At 600, a set of information bits and at least one nub are received at a receiver over one or more communications channels. The nub may have a length N−K, while the received set of information bits is divisible along one dimension into K subsets, where K>4 and N>K.

At 602, a calculation of K receiver-calculated determiners is made at the receiver based on the received set of information bits. Each receiver-calculated determiner may be a linear function of a respective one of the K subsets of received information bits and may have a length of T bits, where T is an integer greater than four, for example. Each receiver-calculated determiner may consist of single bits or one or more multi-bit symbols. These calculations result in a sequence of K receiver-calculated determiners. Additional receiver-calculated determiners may be calculated in one or more additional dimensions in a similar manner.

At 604, FEC decoding is applied to the K receiver-calculated determiners and the received nub. This FEC decoding results in K FEC-corrected determiners and a FEC-corrected nub.

At 606, the receiver calculates the difference between the K FEC-corrected determiners and the K receiver-calculated determiners. For example, the FEC-corrected determiners may be subtracted from the receiver-calculated determiners, which will generate an error syndrome for each receiver-calculated determiner.

At 608, the receiver may use the difference calculated at 606 to correct at least one error in the received set of information bits. For example, from each non-zero error syndrome, it may be possible to determine the location of at least one error within the corresponding subset (i.e., vector), and to correct the error.

Although not explicitly illustrated, the preceding examples may be extended to a t-error-correcting BCH code, where t>1, thereby resulting in t determiners per vector. In one example, each of the t columns of determiners could be compressed to a separate nub.

Rather than transmitting each of a plurality of nubs to the receiver, one or more of the nubs may be treated as intermediate non-transmitted nubs that are compressed into one or more nubs that are actually transmitted. This may be achieved using a series of FEC encoding stages, as will be described in the following example. While this additional compression may lower the BER tolerance, it may provide the advantage of significantly reducing the amount of redundancy transmitted in the compression code, thereby increasing the information rate.

Figure 7:
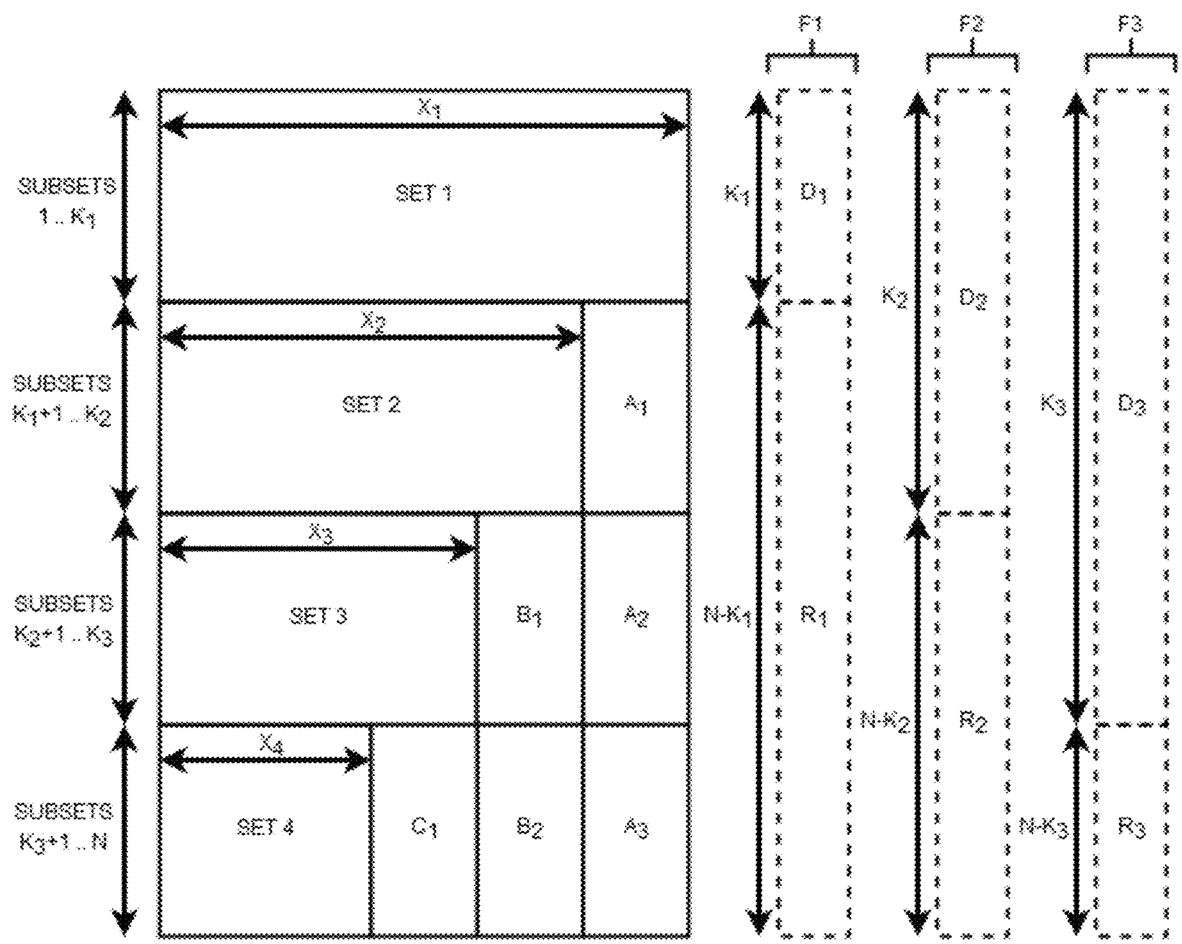
FIG. 7 illustrates a schematic representation of a second example of FEC with compression coding.

FIG. 7 illustrates a schematic representation of a second example of FEC with compression coding. In this example, compression of the redundancy is achieved using a series of FEC encoding stages.

In a first stage, a first set of information bits, denoted as SET 1, comprises $K_1$ subsets, where each subset has a length of $X_1$. For ease of explanation, SET 1 in this example is arranged into a two-dimensional array, where each of the $K_1$ subsets comprises a different row of the array, and where each row has a length of $X_1$ bits. For each of the $K_1$ rows, a first determiner is calculated, thereby resulting in a sequence of $K_1$ first determiners, denoted as $D_1$. The calculation of the first determiners may be denoted as $D_1(i)=d_1(SET1(i))$, for $i=1 \ldots K_1$, where $d_1$ denotes a first function that is dependent on the bits of row i. FEC encoding using a first FEC scheme $F_1$ may be applied to the first determiners $D_1$, which results in a set of $N-K_1$ redundant bits, denoted as a first intermediate nub $R_1$. The first FEC scheme $F_1$ may be relatively strong, thereby resulting in the first intermediate nub $R_1$ being relatively large in size (i.e., adding a significant amount of redundancy to the first determiners $D_1$ in order to satisfy the requirements of the first FEC scheme $F_1$).

A second set of information bits, denoted as SET 2, comprises $K_2-K_1$ subsets, where each subset has a length of $X_2$, and where $X_2<X_1$. SET 2 in this example is arranged into a two-dimensional array, where each of the $K_2-K_1$ subsets comprises a different row of the array, and where each row has a length of $X_2$ bits. The $K_2-K_1$ rows of SET 2 follow the $K_1$ rows of SET 1, such that the first row of SET 2 may be denoted as row $K_1+1$ and the last row of SET 2 may be denoted $K_2$. A set of redundant values, denoted as redundancy $A_1$, may be appended to the SET 2.

However, rather than calculating the redundancy $A_1$ such that it satisfies the constraint that the syndrome of each of rows $K_1+1 \ldots K_2$ has a value of zero, in this example, the redundancy $A_1$ may instead be calculated to satisfy the constraint that the first determiner $d_1$ of each of these rows has a value taken from the first intermediate nub $R_1$. For example, the redundancy $A_1(1)$ appended to the first row of SET 2 (i.e., row $K_1+1$ overall) may be calculated such that the first determiner $d_1$ of row $K_1+1$ is equal to the first value of the first intermediate nub, that is $D_1(\text{row } K_1+1)=R_1(1)$. In general, the redundancy $A_1(i)$ may be calculated so as to satisfy the relationship: $D_1(\text{row } K_1+i)=R_1(i)$, for $i=1 \ldots K_2-K_1$. This relationship uniquely determines the values of redundancy $A_1(i)$.

Together, SET 1 and SET 2 of information bits and redundancy $A_1$, consist of $K_2$ rows, each row having a length of $X_1$ bits. In a second stage of FEC encoding, for each of these $K_2$ rows, a second determiner is calculated, thereby resulting in a sequence of $K_2$ second determiners, denoted as $D_2$. The calculation of the second determiners may be denoted as $D_2(i)=d_2(\text{row } i)$, for $i=1 \ldots K_2$, where $d_2$ denotes a second function that is dependent on the bits of row i. As an example, functions $d_1$ and $d_2$ may be defined that are each linear combinations of the bits of each row, that is, $d_1(\text{row } i)=\Sigma b_{ik} \alpha_1^k$ and $d_2(\text{row } i)=\Sigma b_{ik} \alpha_2^k$, where $\alpha_1$ and $\alpha_2$ are members of a Galois Field (GF) of proper size, and where $b_{ik}$, $1 \le k \le X_1$, are bits of row i. FEC encoding using a second FEC scheme F2 may be applied to the second determiners $D_2$, which results in a set of $N-K_2$ redundant bits, denoted as a second intermediate nub $R_2$. The second FEC scheme F2 may provide less protection than the first FEC scheme F1, thereby resulting in the second intermediate nub $R_2$ being smaller in size than the first intermediate nub $R_1$, as illustrated in FIG. 7.

A third set of information bits, denoted as SET 3, comprises $K_3-K_2$ subsets, where each subset has a length of $X_3$, and where $X_3<X_2$. SET 3 in this example is arranged into a two-dimensional array, where each of the $K_3-K_2$ subsets comprises a different row of the array, and where each row has a length of $X_3$ bits. The $K_3-K_2$ rows of SET 3 follow the $K_2$ rows of SET 1 and SET 2, such that the first row of SET 3 may be denoted as row $K_2+1$ and the last row of SET 3 may be denoted $K_3$. Two sets of redundant values, denoted as redundancy $B_1$ and redundancy $A_2$, respectively, may be appended to SET 3. The redundancy $B_1$ and the redundancy $A_2$ may be calculated to satisfy two constraints: (1) the first determiner $D_1$ of each of these rows may have a value from the first intermediate nub $R_1$; and (2) the second determiner $D_2$ of each of these rows may have a value from the second intermediate nub $R_2$. For example, the redundancy $B_1(1)$ and the redundancy $A_2(1)$ appended to the first row of SET 3 (i.e., row $K_2+1$ overall) may be calculated such that $D_1(\text{row } K_2+1)=R_1(K_2-K_1+1)$ and such that $D_2(\text{row } K_2+1)=R_2(1)$. In general, the redundancy $B_1(i)$ and the redundancy $A_2(i)$ may be calculated so as to satisfy the following two constraints: (1) $D_1(\text{row } K_2+1)=R_1(K_2-K_1+i)$ and (2) $D_2(\text{row } K_2+i)=R_2(i)$, for $i=1 \ldots K_3-K_2$. These two constraints uniquely determine values of redundancies $B_1(i)$ and $A_2(i)$. As illustrated in FIG. 7, because more constraints are placed on rows $K_2+1$ to $K_3$, (relative to rows $K_1+1$ to $K_2$), these rows contain more redundancy.

Together, SET 1, SET 2 and SET 3 of information bits and redundancy $A_1$, $B_1$, and $A_2$ consist of $K_3$ rows, each row having a length of $X_1$ bits. In a third stage of FEC encoding, for each of these $K_3$ rows, a third determiner is calculated, thereby resulting in a sequence of $K_3$ third determiners, denoted as $D_3$. The calculation of the third determiners may be denoted as $D_3(i)=d_3(\text{row } i)$, for $i=1 \ldots K_3$, where $d_3$ denotes a third function that is dependent on the bits of row i. As an example, functions $d_1$, $d_2$, and $d_3$ may be defined that are each linear combinations of the bits of each row, that is, $d_1(\text{row } i)=\Sigma b_{ik} \alpha_1^k$, $d_2(\text{row } i)=\Sigma b_{ik} \alpha_2 k$ and $d_3(\text{row } i)=\Sigma b_{ik} \alpha_3 k$ where $\alpha_1$, $\alpha_2$, and $\alpha_3$ are members of a Galois Field (GF) of proper size, and where $b_{ik}$, $1 \le k \le X_1$, are bits of row i. FEC encoding using a third FEC scheme $F_3$ may be applied to the third determiners $D_3$, which results in a set of $N-K_3$ redundant bits, denoted as a third intermediate nub $R_3$. The third FEC scheme $F_3$ may provide less protection than the FEC schemes $F_1$ and $F_2$, thereby resulting in the third intermediate nub $R_3$ being smaller in size than the first and second intermediate nubs $R_1$ and $R_2$.

A fourth set of information bits, denoted as SET 4, comprises $N-K_3$ subsets, where each subset has a length of $X_4$, and where $X_4<X_3$. SET 4 in this example is arranged into a two-dimensional array, where each of the $N-K_3$ subsets comprises a different row of the array, and where each row has a length of $X_4$ bits. The $N-K_3$ rows of SET 4 follow the $K_3$ rows of SET 1, SET 2 and SET 3, such that the first row of SET 4 may be denoted as row $K_3+1$ and the last row of SET 4 may be denoted N. Three sets of redundant values, denoted as redundancy $C_1$, redundancy $B_2$, and redundancy $A_3$, may be appended to SET 4. The redundancies $C_1$, $B_2$, and $A_3$ may be calculated to satisfy three constraints: (1) the first determiner $d_1$ of each of these rows may have a value from the first intermediate nub $R_1$; the second determiner $d_2$ of each of these rows may have a value from the second intermediate nub $R_2$; and (3) the third determiner $d_3$ of each of these rows may have a value from the third intermediate nub $R_3$. For example, the redundancies $C_1(1)$, $B_2(1)$, and $A_3(1)$ appended to the first row of SET 4 (i.e., row $K_3+1$ overall) may be calculated such that $D_1(K_3+1)=R_1(K_3-K_1+1)$ and such that $D_2(\text{row } K_3+1)=R_2(K_3-K_2+1)$ and such that $D_3(\text{row } K_3+1)=R_3(1)$. In general, the redundancies $C_1(i)$, $B_2(i)$ and $A_3(i)$ may be calculated so as to satisfy the following three constraints: (1) $D_1(\text{row } K_3+i)=R_1(K_3-K_1+i)$; (2) $D_2(\text{row } K_3+i)=R_2(K_3-K_2+i)$; and (3) $D_3(\text{row } K_3+i)=R_3(i)$, for $i=1 \ldots N-K_3$. These three constraints uniquely determine values of redundancies $C_1(i)$, $B_2(i)$ and $A_3(i)$. As illustrated in FIG. 7, because more constraints are placed on rows $K_3+1$ to N, (relative to rows $K_1+1$ to $K_2$ and rows $K_2+1$ to $K_3$), these rows contain the most redundancy.

According to this example, what is transmitted to the receiver is an array consisting of N rows, each having a length of $X_1$ bits. The first $K_1$ rows consist solely of information bits (SET 1); the next $K_2-K_1$ rows consist of information bits (SET 2) and redundancy $A_1$; the next $K_3-K_2$ rows consist of information bits (SET 3) and redundancy $B_1$ and $A_2$; and the final $N-K_3$ rows consist of information bits (SET 4) and redundancy $C_1$, $B_2$, and $A_3$. The redundancy added by the FEC schemes $F_1$, $F_2$, and $F_3$ is effectively compressed into redundancies $A_1$, $A_2$, $A_3$, $B_1$, $B_2$, and $C_1$. Redundancies $A_1$, $A_2$, and $A_3$ may be understood as corresponding to a first transmitted nub; redundancies $B_1$ and $B_2$ may be understood as corresponding to a second transmitted nub; and redundancy $C_1$ may be understood as corresponding to a third transmitted nub. The determiners $D_1$, $D_2$, and $D_3$, and the intermediate nubs $R_1$, $R_2$, and $R_3$ are not actually transmitted to the receiver, but are used in the compression of the redundancy.

Error detection and correction may be performed at the receiver in stages, corresponding to the stages used to compress the redundancy at the transmitter. The functions $d_1$, $d_2$, and $d_3$ are shared between the transmitter and the receiver, such that the receiver may employ the same functions to calculate the first, second, and third determiners, respectively, which may be used to detect and correct errors in the receiver data.

In a first stage, for each of the N received rows, a receiver-calculated first determiner may be calculated, thereby resulting in N receiver-calculated first determiners. FEC decoding corresponding to the first FEC scheme F1 may be applied to the N receiver-calculated first determiners in order to obtain N FEC-corrected first determiners. Upon comparing the N FEC-corrected first determiners to the N receiver-calculated first determiners, the receiver may identify rows that contain bit errors. A 1-error-correcting BCH code may be used to correct a single error per row.

After performing corrections based on FEC-correction of the first determiners, errors may still remain. A second stage of error correction may be used to correct at least some of these errors. In this second stage, for the N rows that have already undergone the first stage of FEC-correction, N receiver-calculated second determiners may be calculated. FEC decoding corresponding to the second FEC scheme F2 may be applied to the N receiver-calculated second determiners in order to obtain N FEC-corrected second determiners. A comparison of the N FEC-corrected second determiners to the N receiver-calculated second determiners may permit the receiver to identify and correct at least some of the remaining bit errors that were not corrected during the first stage.

In a third stage of error correction, for the N rows that have already undergone the first and second stages of FEC-correction, N receiver-calculated third determiners may be calculated. FEC decoding corresponding to the third FEC scheme F3 may be applied to the N receiver-calculated third determiners in order to obtain N FEC-corrected third determiners. A comparison of the N FEC-corrected third determiners to the N receiver-calculated third determiners may permit the receiver to identify and correct at least some of the remaining bit errors that were not corrected during the first and second stages.

The N received rows that undergo the first stage of FEC decoding may have a large number of bit errors. It is for this reason that that the first FEC scheme F1 may be very strong, so as to correct as many errors as possible in the first stage. For each subsequent stage of error correction, the number of errors remaining in the N rows is expected to decrease. Accordingly, the overhead of the FEC schemes F2 and F3 may drop rapidly. Since only a small number of the N rows would require a large number of corrections, significant power savings may be achieved using this multi-stage coding strategy.

Figure 8:
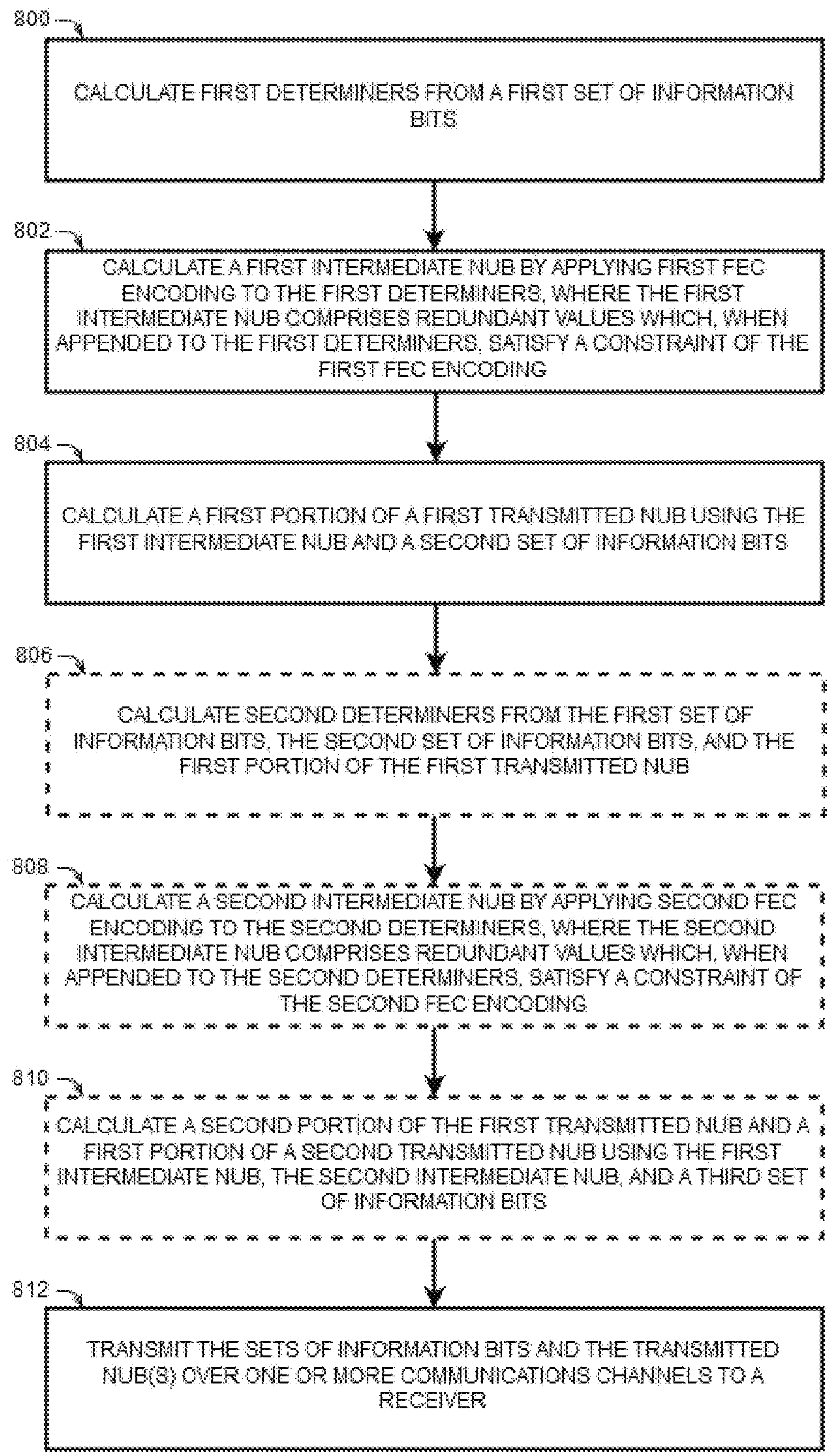
FIG. 8 illustrates a method for data transmission over one or more communications channels, in accordance with some examples of FEC with compression coding.

FIG. 8 illustrates a method for data transmission over one or more communications channels, in accordance with some examples of FEC with compression coding, such as that illustrated in FIG. 7.

At 800, a calculation is made at a transmitter based on a first set of information bits to be encoded for transmission to a receiver. The first set of information bits may be divided along a particular dimension into $K_1$ first subsets, where $K_1$ is an integer greater than four, for example. In one example, each first subset may consist of a distinct row of a two-dimensional array of information bits. For each first subset, a first determiner may be calculated, where the first determiner is a function of the bits in the first subset and has a length of $T_1$ bits, where $T_1$ is an integer greater than four, for example. Each first determiner may consist of single bits or one or more multi-bit symbols. These calculations result in a sequence of $K_1$ first determiners.

At 802, a first intermediate nub is calculated at the transmitter by applying a first FEC encoding scheme to the $K_1$ first determiners, which results in $N-K_1$ redundancy values, where $N>K_1$. These $N-K_1$ redundancy values, which may comprise bits or symbols, constitute the first intermediate nub. When appended to the $K_1$ first determiners, the first intermediate nub satisfies a constraint of the first FEC encoding scheme.

At 804, a first portion of a first transmitted nub is calculated at the transmitter based on the first intermediate nub and a second set of information bits to be encoded for transmission to a receiver. The second set of information bits may be divided into $K_2-K_1$ second subsets along the same particular dimension as the first set of information bits, where $K_2>K_1$. Each second subset is shorter in length than each first subset by a length equivalent to the length of each first determiner. The first portion of the first transmitted nub may be determined by calculating the redundancy which, when appended to the $K_2-K_1$ second subsets, would satisfy the requirement that the first determiners of the $K_2-K_1$ second subsets, together with their respective redundancies, are equal to corresponding values from the first intermediate nub.

In the event that $N=K_2$, the first portion of the first transmitted nub is also the last portion (i.e., the only portion). All $N-K_1$ values of the first transmitted nub would be calculated as the sum of all $N-K_1$ values of the intermediate nub and the syndromes of the $N-K_1$ second subsets. In this case, the method would proceed to step 812, where the first set of information bits, the second set of information bits, and the first transmitted nub would be transmitted to the receiver.

In the event that $N>K_2$, the method may proceed to step 806.

At 806, a calculation is made at the transmitter based on the first set of information bits, the second set of information bits, and the first portion of the first transmitted nub. For each first subset and for each second subset (plus its respective redundancy, as calculated at 804), a second determiner may be calculated, where the second determiner is a function of the bits to which the function is applied and has a length of $T_2$ bits, where $T_2$ is an integer greater than four, for example. Each second determiner may consist of single bits or one or more multi-bit symbols. These calculations result in a sequence of $K_2$ second determiners.

At 808, a second intermediate nub may be calculated at the transmitter by applying a second FEC encoding scheme to the $K_2$ second determiners, which results in $N-K_2$ redundancy values, where $N>K_2$. These redundancy values, which may comprise bits or symbols, constitute the second intermediate nub. When appended to the $K_2$ second determiners, the second intermediate nub satisfies a constraint of the second FEC encoding scheme. The second FEC encoding scheme provides less protection than the first FEC encoding scheme.

At 810, a second portion of the first transmitted nub and a first portion of a second transmitted nub are calculated at the transmitter based on the first intermediate nub, the second intermediate nub, and a third set of information bits to be encoded for transmission to a receiver. The third set of information bits may be divided into $K_3-K_2$ third subsets along the same particular dimension as the first and second sets of information bits, where $K_3>K_2$. Each third subset is shorter in length than each second subset by a length equivalent to the length of each second determiner. The second portion of the first transmitted nub and the first portion of the second transmitted nub may be determined by calculating the redundancy which, when appended to the $K_3-K_2$ third subsets, would satisfy the requirements that: (1) the first determiners of the $K_3$-$K_2$ third subsets, together with their respective redundancies, are equal to corresponding values from the first intermediate nub; and (2) the second determiners of the $K_3-K_2$ third subsets, together with their respective redundancies, are equal to corresponding values from the second intermediate nub.

In the event that $N=K_3$, the second portion of the first transmitted nub is also the last portion (i.e., the first transmitted nub contains only two portions), while the first portion of the second transmitted nub is also the last portion (i.e., the second transmitted nub contains only one portion). In this case, the method may proceed to step 812, where the first set of information bits, the second set of information bits, the third set of information bits, the first transmitted nub, and the second transmitted nub would be transmitted to the receiver.

In the event that $N>K_3$, prior to proceeding to step 812, the actions performed at 806, 808, and 810 could be repeated for the calculation of one or more additional sets of determiners and one or more additional intermediate nubs, which could be used in the encoding of one or more additional sets of information bits. This would result in additional portions being added to the existing transmitted nubs, as well as the generation of one or more additional transmitted nubs. Each set of determiners could be encoded using a progressively higher-rate FEC scheme, thereby resulting in transmitted nubs of progressively smaller size.

At 812, one or more sets of information bits and one or more transmitted nubs may be transmitted over one or more communications channels to the receiver. The one or more intermediate nubs are not transmitted, but are instead used to calculate the transmitted nubs, which provides for even more compression of the redundancy.

Figure 9:
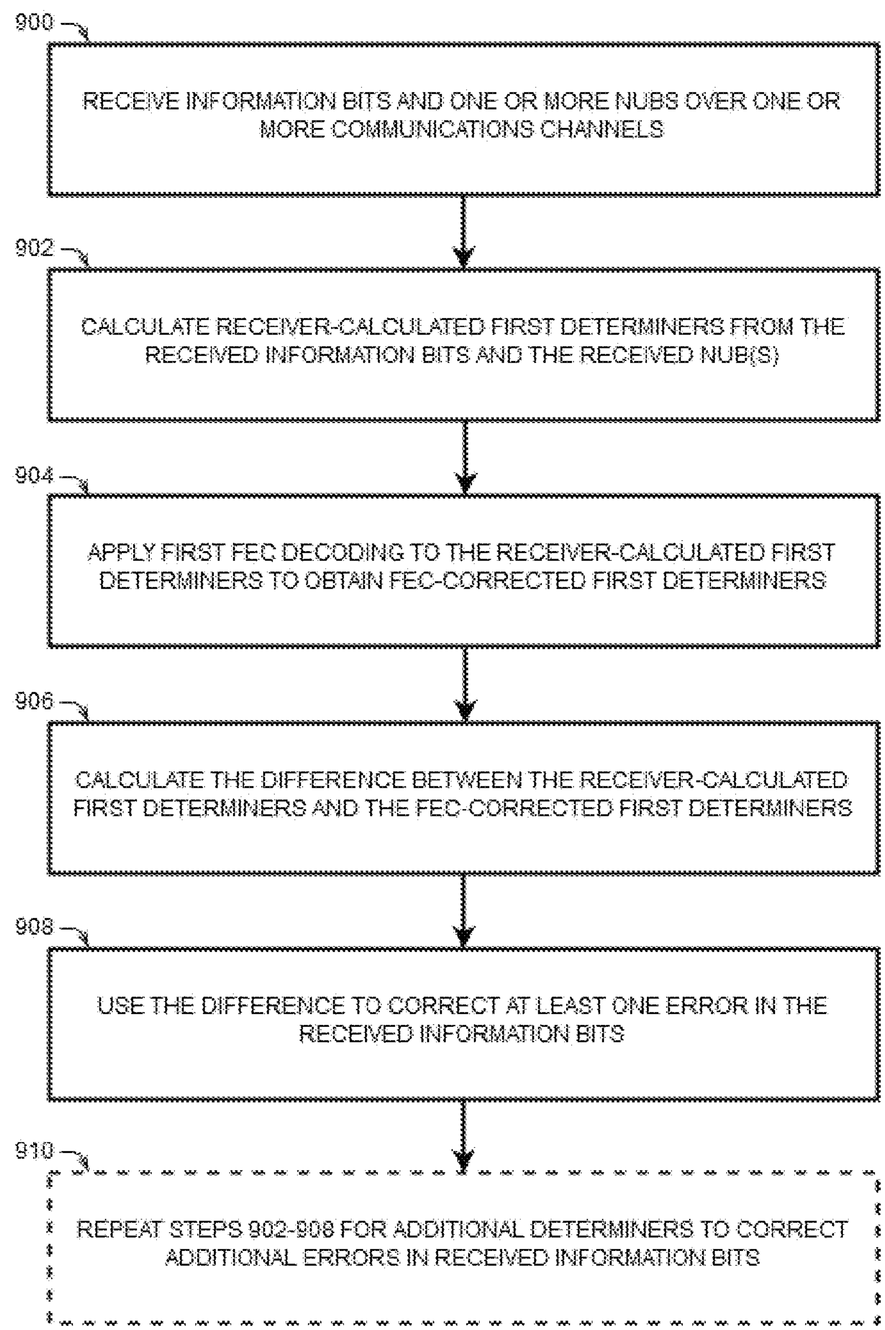
FIG. 9 illustrates a method for decoding information bits received over one or more communications channels, in accordance with some examples of FEC with compression coding.

FIG. 9 illustrates a method for decoding information bits received over one or more communications channels, in accordance with some examples of FEC with compression coding, such as that illustrated in FIG. 7.

At 900, one or more sets of information bits and one or more nubs are received over one or more communications channels at a receiver. Together, the sets of information bits and the one or more nubs may be divisible along a particular dimension into N subsets, where N is an integer greater than four, for example. In one example, each subset might consist of a distinct row of a two-dimensional array formed from the sets of information bits and the one or more nubs.

At 902, a calculation of N receiver-calculated first determiners may be made at the receiver based on the respective N subsets. Each receiver-calculated first determiner is a function of the bits to which the function is applied, and has a length of $T_1$ bits, where $T_1$ is an integer greater than four, for example. Each receiver-calculated first determiner may consist of single bits or one or more multi-bit symbols. These calculations result in a sequence of N receiver-calculated first determiners.

At 904, first FEC decoding may be applied to the N receiver-calculated first determiners and a first received nub. This first FEC decoding results in N FEC-corrected first determiners and a FEC-corrected first nub.

At 906, the receiver may calculate the difference between the N receiver-calculated first determiners and the N FEC-corrected first determiners. For example, the N FEC-corrected first determiners may be subtracted from the N receiver-calculated first determiners, which will generate an error syndrome for each receiver-calculated first determiner.

At 908, the receiver may use the difference calculated at 906 to correct at least one error in the received sets of information bits. For example, from each non-zero error syndrome, it may be possible to determine the location of at least one error within the corresponding subset, and to correct the error.

Steps 902, 904, 906, and 908 may be repeated for one or more additional sets of determiners, as denoted at 910. For example, N receiver-calculated second determiners could be calculated using the received information bits and the one or more received nubs. Second FEC decoding could be applied to the N receiver-calculated second determiners and a second received nub to obtain N FEC-corrected second determiners. The receiver could then correct at least one additional error in the received information bits using the N FEC-corrected second determiners and the N receiver-calculated second determiners.

Because the first determiners will have been encoded using the strongest FEC encoding scheme, a significant number of errors may be correcting using the FEC-corrected first determiners. The subsequent sets of determiners (i.e., second, third, etc.) will have been encoded using successively higher-rate FEC encoding schemes, and accordingly the resulting sets of FEC-corrected determiners may result in successively fewer error corrections.

Numerous variations of the above examples are contemplated.

In some examples, FEC codes other than BCH and RS may be used. In one example, a Golay code could be used for 50% compression. However, multi-bit symbol error tolerance may be desirable for compression since each bit error in a vector is expected to flip half of the bits of the corresponding determiners. In some examples, RS coding could be used to create some or all of the determiners, with multi-bit symbols. For example, RS-8 uses 8-bit symbols. According to some examples, the new modal-decoded GLDPC code could be used for compressing the first nub because of its high tolerance to multiple symbol errors.

In some examples, iterative decoding may be used at the receiver. In some examples, soft decoding may be used in part or all of the error correction calculations.

In some examples, one or more first determiners for each vector may be transmitted instead of being compressed to one or more nubs, and only the later determiners may be compressed. Portions of determiners may be transmitted as well as or instead of being compressed.

In some examples, a nub may receive additional protection from other FEC outside of this block, or be transmitted or coded in a manner that is distinct from substantially all of the information bits.

In some examples, multiple types of determiners may be compressed together into various shapes of nub.

In some examples, multiple determiners from the same vector may be treated as one large symbol for the compression.

The preceding examples have involved compression coding in one or two dimensions. However, it is contemplated that the principles of compression coding may be extended to a third or greater dimension. In three-dimensional compression coding, determiners of determiners may be compressed along a third dimension and transmitted to a receiver.

What is claimed is:

1. A method of transmission over one or more communications channels, the method comprising:

calculating from a set of information bits a plurality of first determiners, each first determiner calculated from a different first subset of the information bits along a first dimension, wherein the plurality of first determiners is an integer greater than four;

calculating from the plurality of first determiners a first nub comprising a first number of redundant bits that is less than a number of bits comprised in the plurality of first determiners;

calculating from the set of information bits a plurality of second determiners, each second determiner calculated from a different second subset of the information bits along a second dimension that differs from the first dimension, wherein the plurality of second determiners is an integer greater than four, and wherein an intersection of the plurality of first determiners and the plurality of second determiners comprises at least one bit;

calculating from the plurality of second determiners a second nub comprising a second number of redundant bits that is less than a number of bits comprised in the plurality of second determiners; and transmitting the set of information bits, the first nub, and the second nub over the one or more communications channels.

2. The method as claimed in claim 1, wherein the first dimension is substantially orthogonal to the second dimension.

3. The method as claimed in claim 1, further comprising calculating from the set of information bits a plurality of third determiners, each third determiner calculated from a different third subset of the information bits along a third dimension that differs from the first dimension and from the second dimension;

calculating from the plurality of third determiners a third nub comprising a third number of redundant bits that is less than a number of bits comprised in the plurality of third determiners; and transmitting the third nub over the one or more communication channels.

4. The method as claimed in claim 3, wherein the third dimension is diagonal to the first dimension and to the second dimension.

5. The method as claimed in claim 1, wherein the first determiners or the second determiners or both are calculated using a binary Bose-Chaudhuri-Hocquenghem (BCH) code.

6. The method as claimed in claim 1, wherein the first nub or the second nub or both are calculated using a Reed-Solomon code.

7. The method as claimed in claim 1, further comprising transmitting the set of information bits in a first manner; and transmitting the first nub and the second nub in a second manner that is distinct from the first manner.

8. An electronic device comprising:

circuitry configured to calculate from a set of information bits a plurality of first determiners, each first determiner calculated from a different first subset of the information bits along a first dimension, wherein the plurality of first determiners is an integer greater than four;

circuitry configured to calculate from the plurality of first determiners a first nub comprising a first number of redundant bits that is less than a number of bits comprised in the plurality of first determiners;

circuitry configured to calculate from the set of information bits a plurality of second determiners, each second determiner calculated from a different second subset of the information bits along a second dimension that differs from the first dimension, wherein the plurality of second determiners is an integer greater than four, and wherein an intersection of the plurality of first determiners and the plurality of second determiners comprises at least one bit;

circuitry configured to calculate from the plurality of second determiners a second nub comprising a second number of redundant bits that is less than a number of bits comprised in the plurality of second determiners; and circuitry configured to transmit the set of information bits, the first nub, and the second nub over the one or more communications channels.

9. The electronic device as claimed in claim 8, wherein the first dimension is substantially orthogonal to the second dimension.

10. The electronic device as claimed in claim 8, further comprising circuitry configured to calculate from the set of information bits a plurality of third determiners, each third determiner calculated from a different third subset of the information bits along a third dimension that differs from the first dimension and from the second dimension;

circuitry configured to calculate from the plurality of third determiners a third nub comprising a third number of redundant bits that is less than a number of bits comprised in the plurality of third determiners; and circuitry configured to transmit the third nub over the one or more communication channels.

11. The electronic device as claimed in claim 10, wherein the third dimension is diagonal to the first dimension and to the second dimension.

12. The electronic device as claimed in claim 8, wherein the first determiners or the second determiners or both are calculated using a binary Bose-Chaudhuri-Hocquenghem (BCH) code.

13. The electronic device as claimed in claim 8, wherein the first nub or the second nub or both are calculated using a Reed-Solomon code.

14. The electronic device as claimed in claim 8, further comprising circuitry configured to transmit the set of information bits in a first manner; and circuitry configured to transmit the first nub and the second nub in a second manner that is distinct from the first manner.

15. A non-transitory computer-readable medium storing instructions which, when executed by a processor of an electronic device, cause the processor:

to calculate from a set of information bits a plurality of first determiners, each first determiner calculated from a different first subset of the information bits along a first dimension, wherein the plurality of first determiners is an integer greater than four;

to calculate from the plurality of first determiners a first nub comprising a first number of redundant bits that is less than a number of bits comprised in the plurality of first determiners;

to calculate from the set of information bits a plurality of second determiners, each second determiner calculated from a different second subset of the information bits along a second dimension that differs from the first dimension, wherein the plurality of second determiners is an integer greater than four, and wherein an intersection of the plurality of first determiners and the plurality of second determiners comprises at least one bit;

to calculate from the plurality of second determiners a second nub comprising a second number of redundant bits that is less than a number of bits comprised in the plurality of second determiners; and to transmit the set of information bits, the first nub, and the second nub over one or more communications channels.

16. The non-transitory computer-readable medium as claimed in claim 15, wherein the first dimension is substantially orthogonal to the second dimension.

17. The non-transitory computer-readable medium as claimed in claim 15, wherein the instructions, when executed by the processor, cause the processor to calculate from the set of information bits a plurality of third determiners, each third determiner calculated from a different third subset of the information bits along a third dimension that differs from the first dimension and from the second dimension;

to calculate from the plurality of third determiners a third nub comprising a third number of redundant bits that is less than a number of bits comprised in the plurality of third determiners; and to transmit the third nub over the one or more communication channels.

18. The non-transitory computer-readable medium as claimed in claim 17, wherein the third dimension is diagonal to the first dimension and to the second dimension.

19. The non-transitory computer-readable medium as claimed in claim 15, wherein the first determiners or the second determiners or both are calculated using a binary Bose-Chaudhuri-Hocquenghem (BCH) code.

20. The non-transitory computer-readable medium as claimed in claim 15, wherein the first nub or the second nub or both are calculated using a Reed-Solomon code.

* * * * *

UNITED STATES PATENT AND TRADEMARK OFFICE

CERTIFICATE OF CORRECTION

PATENT NO. : 10,992,416 B2
APPLICATION NO. : 16/802129
DATED : April 27, 2021
INVENTOR(S) : Shahab Oveis Gharan, Mohammad Ehsan Seifi and Kim B. Roberts It is certified that error appears in the above-identified patent and that said Letters Patent is hereby corrected as shown below:

In the Claims

Column 19, Claim 1, Line 3, should read:
calculating from a first set of an array of information bits a plurality of Column 19, Claim 1, Line 5, should read:
a different first subset of the array of information bits along a Column 19, Claim 1, Line 12, should read:
calculating from a second set of the array of information bits a plurality of Column 19, Claim 1, Line 14, should read:
from a different second subset of the array of information bits Column 19, Claim 1, Lines 17-20, should read:
is an integer greater than four, and wherein an intersection of the first set and the second set comprises at least one bit;

Column 19, Claim 1, Line 25, should read:
transmitting the array of information bits, the first nub, and Column 19, Claim 3, Line 2, should read:
calculating from the array of information bits a plurality of Column 19, Claim 3, Line 4, should read:
from a different third subset of the array of information bits Column 19, Claim 7, Line 2, should read:
transmitting the array of information bits in a first manner;

Signed and Sealed this
Twenty-seventh Day of June, 2023

Katherine Kelly Vidal

Katherine Kelly Vidal
*Director of the United States Patent and Trademark Office*

Column 20, Claim 8, Line 2, should read:
circuitry configured to calculate from a first set of an array of information Column 20, Claim 8, Lines 4-5, should read:
calculated from a different first subset of the array of information bits along a first dimension, wherein the plurality Column 20, Claim 8, Lines 11-12, should read:
circuitry configured to calculate from a second set of the array of information bits a plurality of second determiners, each second Column 20, Claim 8, Line 14, should read:
the array of information bits along a second dimension that Column 20, Claim 8, Lines 17-20, should read:
wherein an intersection of the first set and the second set comprises at least one bit;

Column 20, Claim 8, Line 26, should read:
circuitry configured to transmit the array of information bits, Column 20, Claim 10, Lines 3-4, should read:
circuitry configured to calculate from the array of information bits a plurality of third determiners, each third Column 20, Claim 10, Line 6, should read:
the array of information bits along a third dimension that differs Column 20, Claim 14, Line 3, should read:
circuitry configured to transmit the array of information bits Column 21, Claim 15, Line 4, should read:
to calculate from a first set of an array of information bits a plurality of Column 21, Claim 15, Line 6, should read:
a different first subset of the array of information bits along a Column 21, Claim 15, Line 13, should read:
to calculate from a second set of the array of information bits a plurality of Column 21, Claim 15, Line 15, should read:
from a different second subset of the array of information bits Column 21, Claim 15, Lines 18-21, should read:
is an integer greater than four, and wherein an intersection of the first set and the second set comprises at least one bit;

Column 21, Claim 15, Line 26, should read:
to transmit the array of information bits, the first nub, and Column 22, Claim 17, Line 4, should read:
to calculate from the array of information bits a plurality of Column 22, Claim 17, Line 6, should read:
from a different third subset of the array of information bits